United States Patent
Tan et al.

(10) Patent No.: US 8,400,863 B1
(45) Date of Patent: Mar. 19, 2013

(54) CONFIGURABLE MEMORY BLOCK

(75) Inventors: Zun Yang Tan, Kuantan (MY); Wei Yee Koay, Bayan Baru (MY); Boon Jin Ang, Butterworth (MY); Tat Mun Lui, Petaling Jays (MY); Eu Geen Chew, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 133 days.

(21) Appl. No.: 12/860,734

(22) Filed: Aug. 20, 2010

(51) Int. Cl.
*G11C 8/00* (2006.01)

(52) U.S. Cl. .......... 365/230.03; 365/230.05; 365/230.06

(58) Field of Classification Search ............. 365/189.05, 365/189.08, 230.03, 230.06, 230.08, 230.05; 326/39, 41
See application file for complete search history.

(56) References Cited

U.S. PATENT DOCUMENTS

| | | | | |
|---|---|---|---|---|
| 5,430,687 A | * | 7/1995 | Hung et al. | 365/230.08 |
| 6,292,017 B1 | * | 9/2001 | Rangasayee | 365/230.03 |
| 6,298,005 B1 | * | 10/2001 | Landry | 365/230.03 |
| 6,353,552 B2 | * | 3/2002 | Sample et al. | 365/189.08 |
| 6,392,949 B2 | * | 5/2002 | Braceras et al. | 365/230.03 |
| 6,556,500 B2 | * | 4/2003 | Heile | 365/230.03 |
| 6,897,676 B1 | * | 5/2005 | Pang | 365/230.05 |
| 7,268,585 B1 | * | 9/2007 | Reynolds | 326/39 |
| 7,289,372 B1 | * | 10/2007 | Yu et al. | 365/230.05 |
| 7,319,619 B1 | * | 1/2008 | Choe | 365/189.05 |
| 7,397,726 B1 | * | 7/2008 | Yuan et al. | 365/230.05 |

* cited by examiner

*Primary Examiner* — Trong Phan
(74) *Attorney, Agent, or Firm* — Womble Carlyle Sandridge & Rice, LLP

(57) ABSTRACT

Circuits for a memory array and a method of operating a configurable memory block are disclosed. An embodiment of the disclosed memory circuits includes a first memory block coupled to a second memory block to form an array of memory blocks. Each of the memory blocks has multiple bit lines with a dedicated address decoder coupled to the bit lines from each of the memory blocks. Switches are placed in between the first and second memory blocks such that each of the bit lines from the first memory block is connected to a corresponding bitline from the second memory block through one of the switches. The switches may be used to either connect the second memory block to the first memory block or disconnect the second memory block from the first memory block.

20 Claims, 5 Drawing Sheets

CONFIGURABLE MEMORY BLOCK

BACKGROUND

Integrated circuit (IC) devices include various generic structures and logic blocks that can be configured to perform any of a variety of tasks and functions. Some of these logic blocks include logic circuitry, registers, I/O blocks, embedded memory blocks, etc., that are programmable to support a wide array of user applications. For instance, I/O blocks in an IC device can be configured to support different protocols and embedded memory blocks in the IC device are used as buffers to support these different protocols.

Generally speaking, embedded memory blocks in an IC device usually have a predetermined number of memory bits. However, different I/O protocols require buffers in different sizes. Some protocols or systems require deep buffers while others require only shallow buffers. Generally, systems that require shallow buffers may perform faster than systems that require deep buffers. In other words, systems that require fewer memory bits can have a higher operating speed compared to systems that require more memory bits.

However, embedded memory blocks with a fixed number of memory bits have a fixed read and write access time. Consequently, embedded memory blocks that have a fixed number of memory bits may not operate at a higher speed even though only a portion of the available memory bits are used. For example, a high speed serial connection protocol, e.g., Peripheral Component Interconnect Express (PCIe), that have varying operating speeds may be constrained by the maximum read access time of the memory blocks in the device. In other words, memory blocks with a fixed number of memory bits have a fixed access time.

Therefore, it is desirable to have embedded memory blocks with variable buffer depth so that the memory blocks may be configured based on the requirements of the various protocols used in the system. It is within this context that the invention arises.

SUMMARY

Embodiments of the present invention include circuits and a method for designing a memory circuit.

It should be appreciated that the present invention can be implemented in numerous ways, such as a process an apparatus, a system, a device or a method on a computer readable medium. Several inventive embodiments of the present invention are described below.

In one embodiment, a memory circuit disclosed. The memory circuit has a first memory block and a second memory block coupled to the first memory. The two memory blocks form an array of memory blocks with each of the memory blocks having multiple memory bit lines. An address decoder is coupled to the multiple memory bit lines of each of the first and second memory blocks. Switches are placed in between the two memory blocks such that every memory bit line from the first memory block is coupled to a corresponding memory bit line from the second memory block through a switch.

In another embodiment, another memory circuit is disclosed. The memory circuit has one block of memory bits coupled to another block of memory bits to form an array of memory blocks, each block having a dedicated address decoder, in the memory circuit. Switches are placed between the two blocks of memory bits such that the switches connect one block of memory bits to the other when the switches are enabled. One of the blocks of memory bits is disconnected from the array of memory blocks when the switches are disabled.

In yet another embodiment in accordance with the present invention, a method for designing a memory circuit is disclosed. The method includes receiving an operating frequency of the memory circuit in an integrated circuit (IC) design and receiving the number of memory bits required in the IC design. A plurality of switches is set based on the operating frequency and the number of memory bits required in the IC design. The plurality of switches is set to a closed position when the memory circuit is operating at one frequency and is set to an open position when the memory circuit is operating at another frequency.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings.

DETAILED DESCRIPTION

The following embodiments describe circuits and a method for designing a configurable memory circuit.

It will be obvious, however, to one skilled in the art, that the present invention may be practiced without some or all of these specific details. In other instances, well-known operations have not been described in detail in order not to unnecessarily obscure the present invention.

The embodiments described herein provide techniques to create a configurable memory circuit with a variable number of bits. The disclosed embodiments provide configurable memory circuits that can be used to support a variety of protocols and system requirements. Memory circuits described in the following embodiments are configurable such that unused memory bits are disabled or disconnected from the memory blocks to reduce the read and write access time of the memory blocks when a high speed protocol is used. Conversely, a system that requires more memory bits can utilize the full array of memory bits in the memory blocks.

Figure 1:
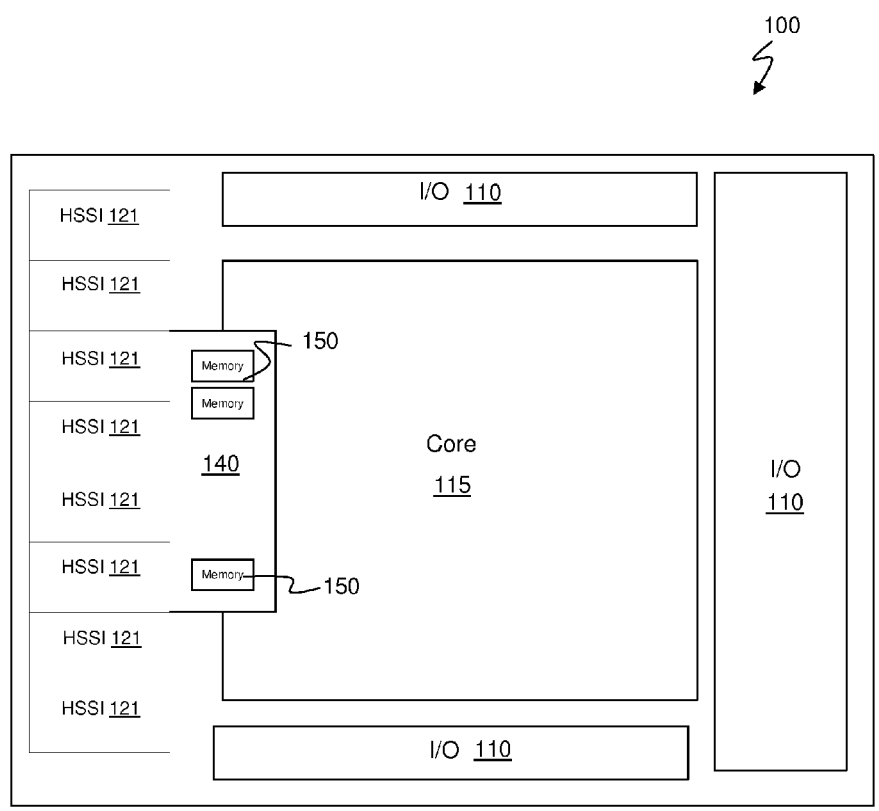
FIG. 1, meant to be illustrative and not limiting, shows a simplified block diagram of programmable logic device (PLD) that can include aspects of the present invention.

FIG. 1, meant to be illustrative and not limiting, shows a simplified block diagram of programmable logic device (PLD) 100 that can include aspects of the present invention. Programmable device 100 includes core logic region 115 and I/O elements 110. I/O elements 110 may support a variety of protocol interfaces. Core logic region 115 may be populated with logic cells which include, among other things, at the most basic level, "logic elements" (LEs). LEs may include look-up table-based logic regions and these logic elements may be grouped into "Logic Array Blocks" (LABs). The logic elements and groups of logic elements or LABs can be configured to perform logical functions desired by the user. Core logic region 115 may also include a plurality of embedded memory blocks 150 that can be used to perform a variety of functions. In one embodiment, embedded memory blocks 150 are used as buffers for protocols implemented on I/O blocks 110. In the exemplary embodiment of FIG. 1, I/O block 110 on the left of PLD 100 is configured as a plurality of high-speed serial interface (HSSI) channels 121 and embedded memory blocks 150 are used as buffers in Peripheral Component Interconnect Express (PCIe) interface block 140. One skilled in the art will appreciate that the embodiments described herein can also be applied to other applications.

Figure 2:
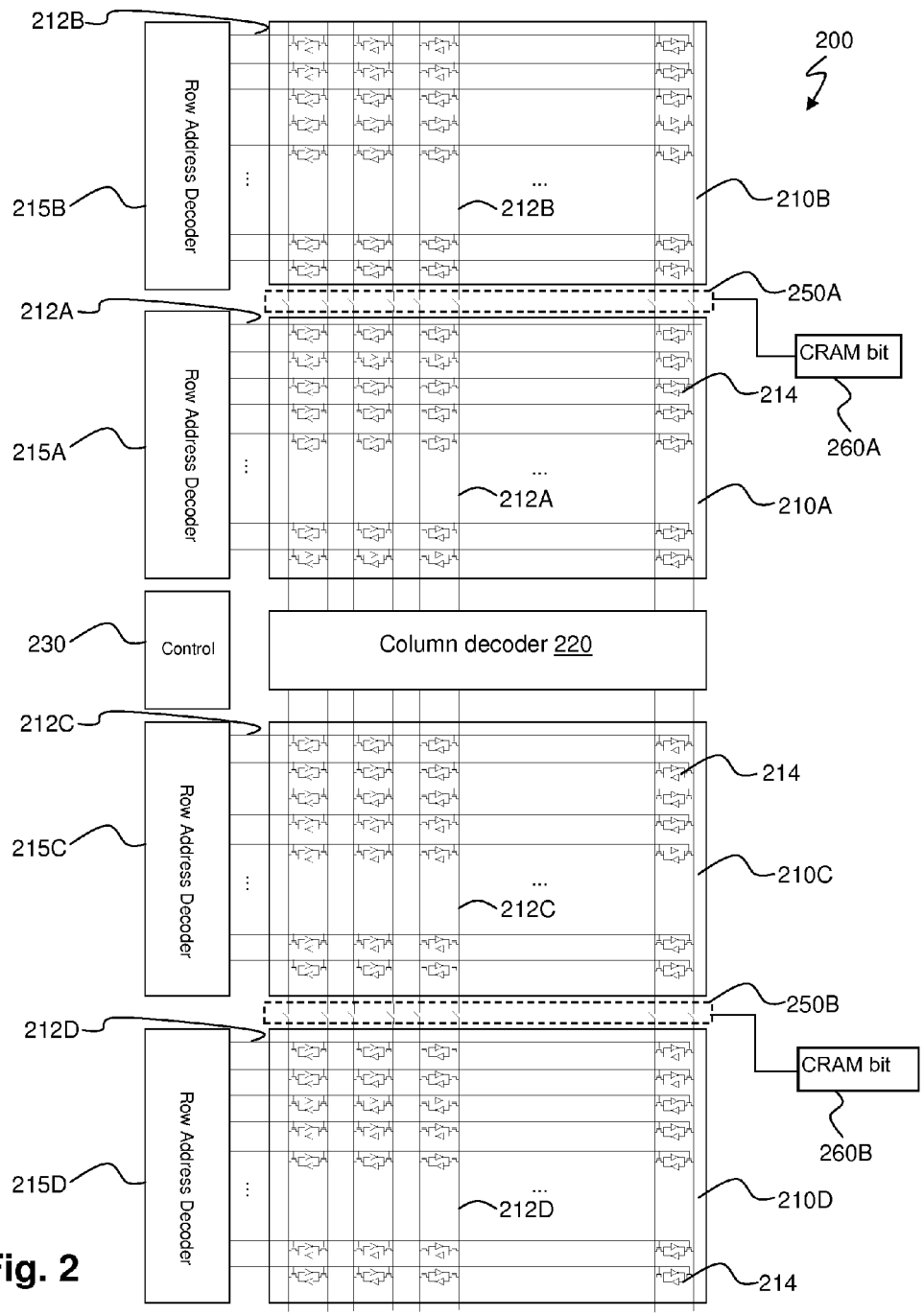
FIG. 2, meant to be illustrative and not limiting, shows a configurable memory circuit with a plurality of switches as one embodiment in accordance with the present invention.

FIG. 2, meant to be illustrative and not limiting, shows configurable memory circuit 200 as one embodiment in accordance with the present invention. Memory blocks 210A-210D are coupled to each other to form an array of memory blocks. Each of memory blocks 210A-210D has multiple bit lines 212A-212D that are connected to row decoders 215A-215D, respectively. Sense amplifier or column decoder 220 is placed in between the array of memory blocks 210A-210D. In the embodiment of FIG. 2, groups of switches 250A and 250B are placed in between memory blocks 210A and 210B, and 210C and 210D, respectively. Switches 250A are coupled to bit lines 212A and 212B and switches 250B are coupled to bit lines 212C and 212D.

Referring still to FIG. 2, bit lines 212A-212D are coupled to each other through switches 250A and 250B. When switches 250A and 250B are disconnected, i.e., left in an open position, memory block 210B is disconnected from memory block 210A and memory block 210D is disconnected from memory block 210C, respectively. In the embodiment of FIG. 2, switches 250A and 250B are pass-gate transistors. It should be appreciated however, that other types of switches or selector circuits may be used in this context. According to one embodiment, switches 250A and 250B are one-time-programmable (OTP) switches. Configurable memory circuit 200 may be integrated in a high speed protocol block on an IC device similar to device 100 of FIG. 1. In the embodiment of FIG. 2, switches 250A and 250B of configurable memory circuit 200 are coupled to configuration random access memory (CRAM) bits 260A and 260B, respectively, and switches 250A and 250B are set according to the setting of the CRAM bits. It should be appreciated that switches 250A and 250B may be configured with one CRAM bit or different CRAM bits, e.g., CRAM bits 260A and 260B, may be used to control the configuration of switches 250A and 250B, respectively. For instance, when more memory bits are required, the CRAM bits 260A and 260B are set such that switches 250A and 250B are set to a close position. If fewer memory bits are required, the CRAM bits 260A and 260B are set so that switches 250A and 250B are set to an open position.

Referring still to FIG. 2, control block 230 contains control logic circuitry that controls the operation of configurable memory circuit 200. For instance, control block 230 may include, among others, control logic that controls the read/write operation of configurable memory circuit 200 and decoding logic that controls accesses to memory circuit 200. In one embodiment, control logic 230 controls and configures memory circuit 200 based on the number of bits required and the operating frequency of memory circuit 200. It should be appreciated that actual connections and the detailed circuitry of control block 230 are not shown in order to not obscure the present invention. It should also be appreciated that even though only a few bit lines and memory elements 214 are shown in each memory block 210A-210D, more or fewer bit lines and memory elements 214 may be used in this context.

Figure 3A:
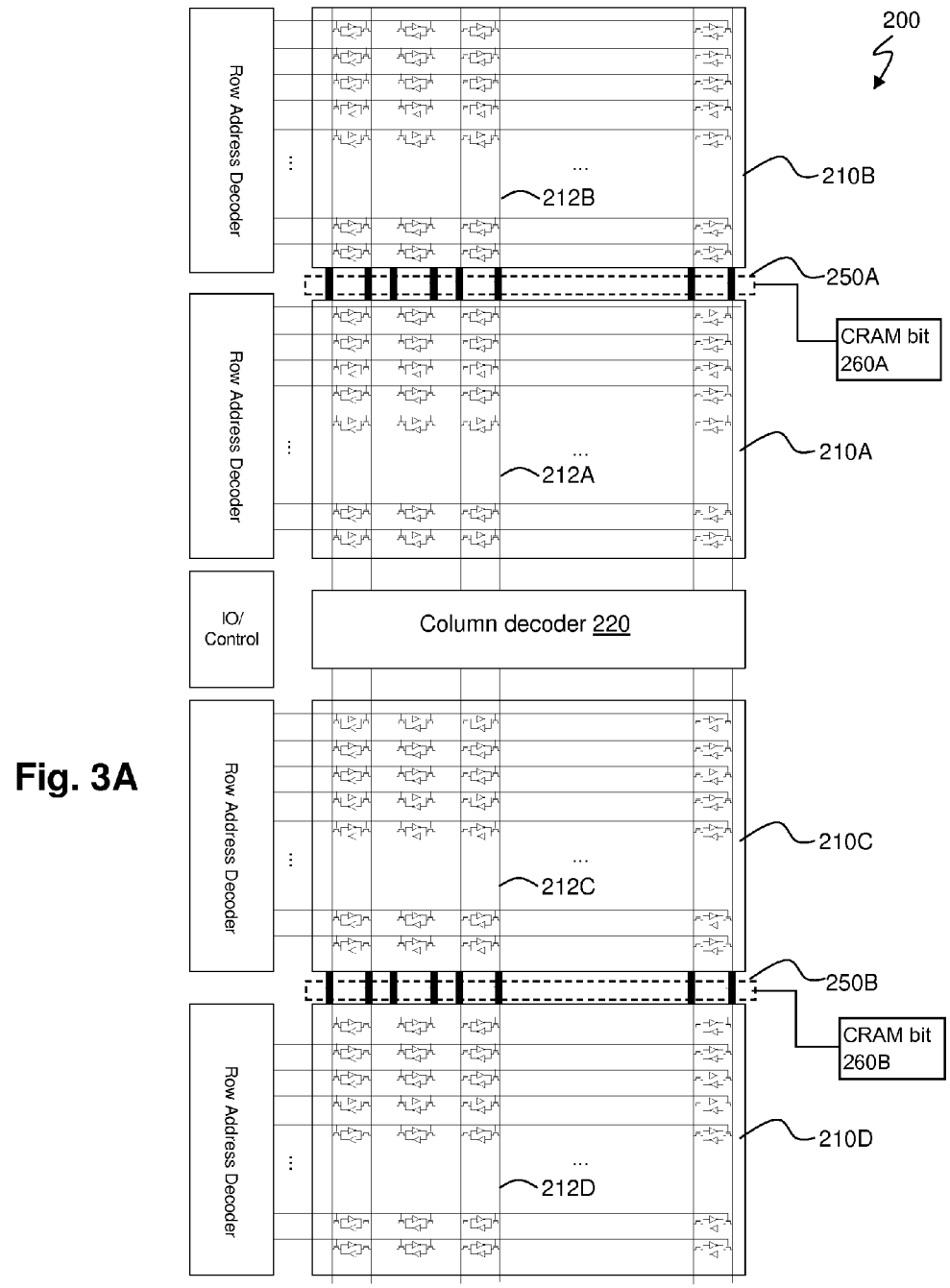
FIG. 3A, meant to be illustrative and not limiting, shows a configurable memory circuit with a plurality of switches set to a close position.

FIG. 3A, meant to be illustrative and not limiting, shows configurable memory circuit 200 with groups of switches 250A and 250B set to a close position. For the sake of brevity, elements that have been shown in FIG. 2 and described above are not repeated. When groups of switches 250A and 250B are enabled, i.e., set to a close position, all the memory blocks 210A-210D are connected to form a full memory array. In other words, all memory blocks 210A-210D are connected to each other through switches 250A and 250B to form a memory array with a maximum number of memory bits available.

Figure 3B:
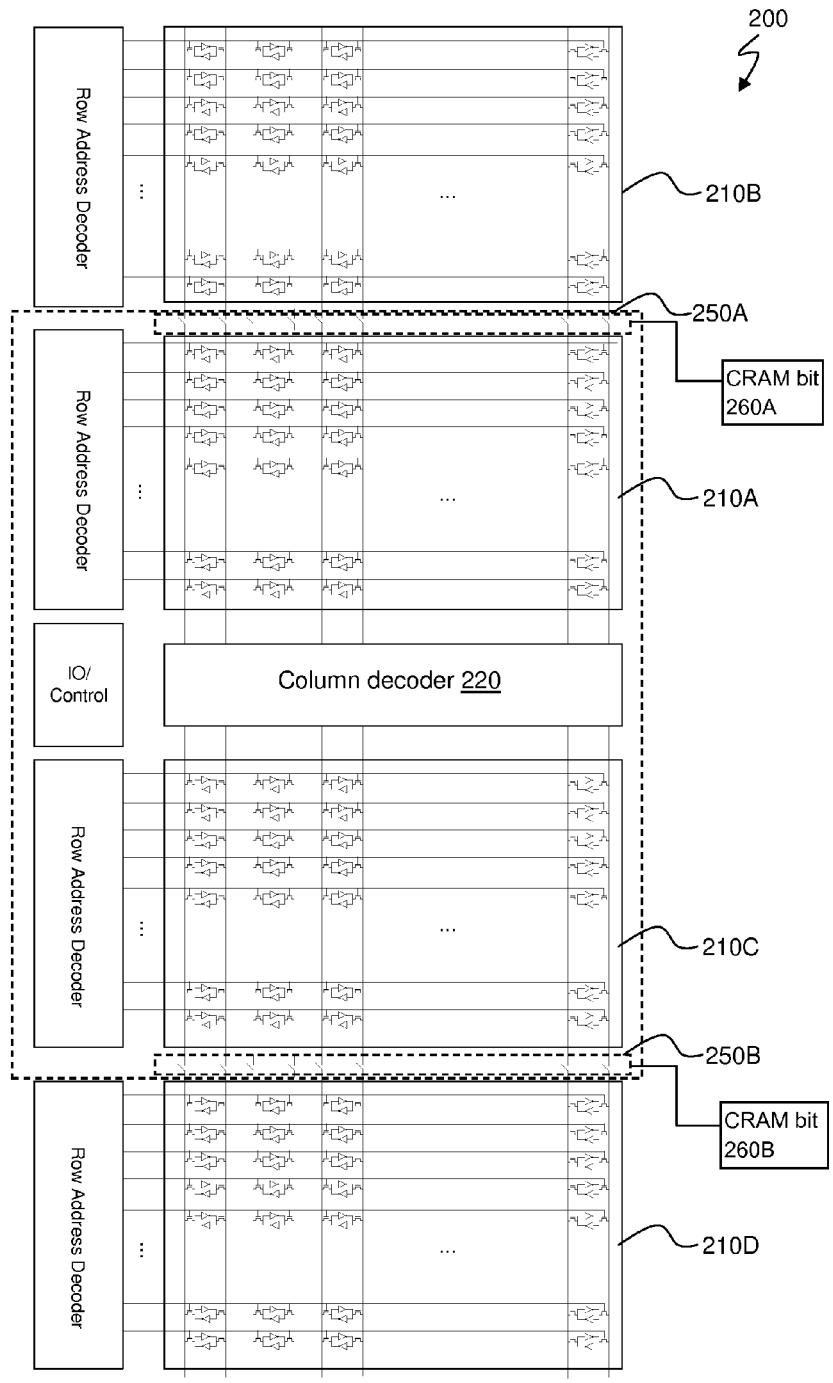
FIG. 3B, meant to be illustrative and not limiting, shows a configurable memory circuit with a plurality of switches set to an open position.

FIG. 3B, meant to be illustrative and not limiting, shows configurable memory circuit 200 with groups of switches 250A and 250B set to an open position. When groups of switches 250A and 250B are disabled, i.e., set to an open position, memory blocks 210B and 210D are disconnected from the memory array. According to one embodiment, when memory blocks 210B and 210D are disconnected from the memory array, memory blocks 210A and 210C remain coupled to column decoder 220 to form a smaller memory array (as represented by the dotted line box in FIG. 3B). In another embodiment, switches 250A and 250B, when disabled, subdivides the memory array in order to increase the read and write access time, i.e., the operating frequency, of memory circuit 200. It should be appreciated that even though only four memory blocks 210A-210D are shown in the embodiments of FIGS. 2, 3A and 3B, more memory blocks, each with a dedicated address decoder, may be coupled to form a larger memory array, with groups of switches placed in between every two memory blocks, connecting the corresponding bit lines.

Figure 4:
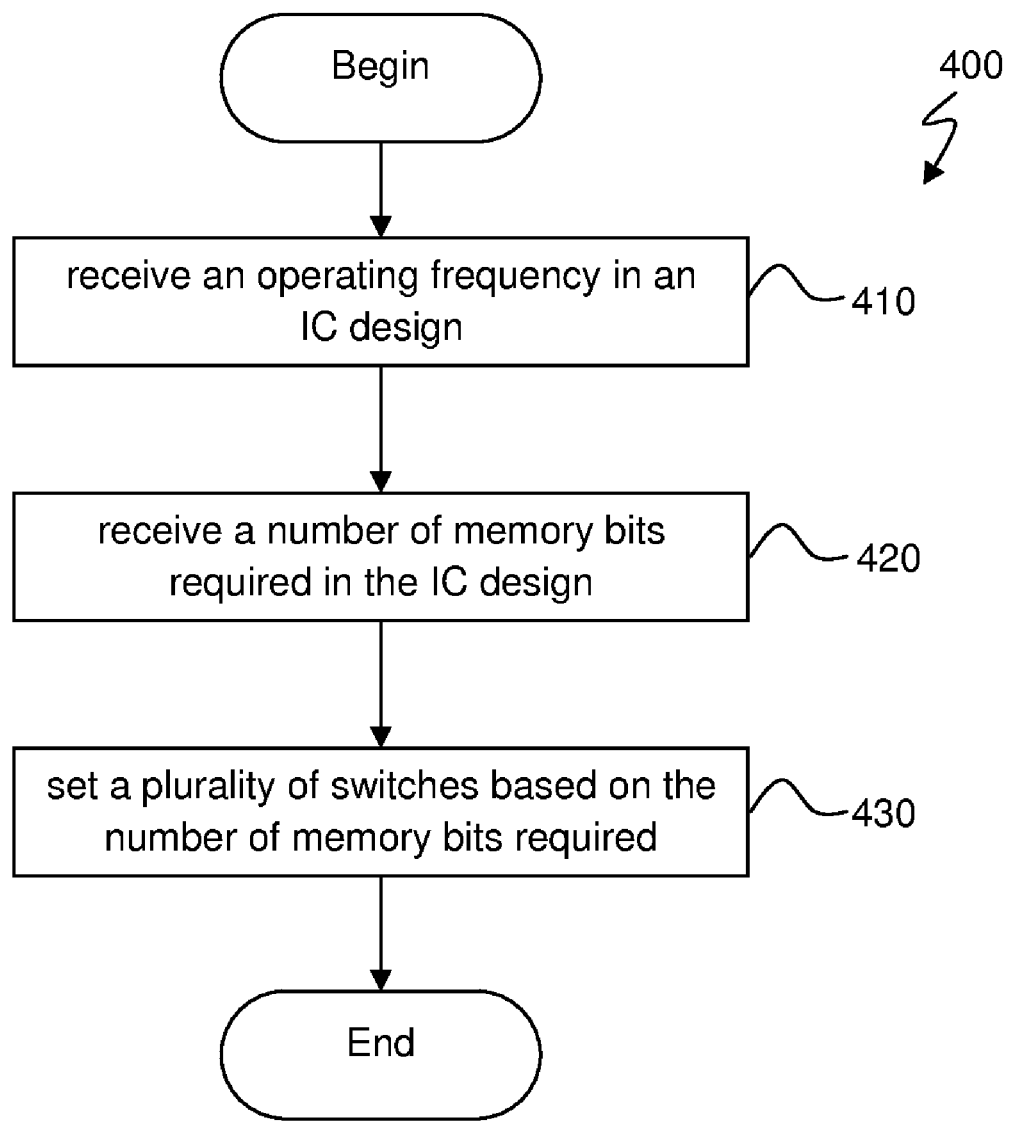
FIG. 4, meant to be illustrative and not limiting, shows a simplified method flow for designing a memory circuit as an embodiment in accordance with the present invention.

FIG. 4, meant to be illustrative and not limiting, shows simplified method flow 400 for designing a memory circuit as an embodiment in accordance with the present invention. An operating frequency of the memory circuit is received in operation 410 and the number of memory bits required in the memory circuit is received in operation 420. According to one embodiment, the memory circuit is an embedded memory circuit in an IC device and the memory circuit is configured based on a design or application placed on the IC device. For instance, an electronic design automation (EDA) tool may be used to configure the IC device and set the number of memory bits required in the memory circuit embedded as a memory block in the IC device. A plurality of switches is set in the operation of 430 to enable or disable the plurality of switches. In one embodiment, the plurality of switches is enabled or set to a closed position, as shown in the embodiment of FIG. 3A, when the memory circuit is utilizing its maximum number of memory bits. In another embodiment, the plurality of switches is disabled or set to an open position, as shown in the embodiment of FIG. 3B, when the memory circuit is operating with fewer number of memory bits. The plurality of switches is set based on the setting of a CRAM bit on the IC device, according to one embodiment. The memory circuit may operate with a maximum number of memory bits when the plurality of switches is enabled. Conversely, the memory circuit may operate at a higher frequency with fewer memory bits when the plurality of switches is disabled.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A memory circuit, comprising:
a first memory block;
a second memory block coupled to the first memory block to form an array of memory blocks, the first and second memory blocks having a plurality of bit lines;
an address decoder coupled to the plurality of bit lines of the first and second memory blocks; and
a plurality of switches placed in between the first and second memory blocks, wherein the plurality of bit lines on the first memory block is coupled to the plurality of bit lines on the second memory block through the plurality of switches,
wherein a transition of the plurality of switches to a particular state impacts a number of memory bits that are available in the array of memory blocks.

2. The memory circuit of claim 1, wherein the plurality of switches subdivides the array in order to increase an operating frequency of the memory circuit.

3. The memory circuit of claim 1, wherein the particular state comprises a disabled state, wherein the transition of the plurality of switches comprises a transition to the disabled state, wherein when transitioned to the disabled state, the second memory block is disconnected from the array and the number of memory bits that are available in the array of memory blocks is reduced.

4. The memory circuit of claim 1, wherein the plurality of switches is a plurality of passgate transistors.

5. The memory circuit of claim 1, wherein the memory circuit is integrated in a high-speed protocol block on an integrated circuit (IC) device.

6. The memory circuit of claim 5, wherein the memory circuit is coupled to a configuration random access memory (CRAM) bit on the IC device, wherein the plurality of switches is transitioned according to the CRAM bit.

7. The memory circuit of claim 1, further comprising:
at least one other memory block coupled to the second memory block in the array of memory blocks;
another plurality of switches placed in between the second memory block and the at least one other memory block;
an address decoder coupled to the first memory block, the second memory block and the at least one other memory block; and
a column decoder coupled in between the array of memory blocks.

8. A memory circuit, comprising:
first block of memory bits;
a second block of memory bits coupled to the first block of memory bits forming an array of memory blocks in the memory circuit; and
a plurality of switches placed in between the first and second blocks of memory bits, wherein a transition of the plurality of switches to an enabled state or a disabled state impacts a number of memory bits that are available in the array of memory blocks, wherein the plurality of switches couples the second block of memory bits to the first block of memory bits when transitioned to the enabled state and disconnects the second block of memory bits from the first block of memory bits when transitioned to the disabled state, and wherein each of the first and second blocks of memory bits has a dedicated address decoder.

9. The memory circuit of claim 8, further comprising:
additional blocks of memory bits coupled to the first and second blocks of memory bits of the array of memory blocks;
another plurality of switches placed in between every two blocks of memory bits of the additional blocks of memory bits; and
a single column decoder placed in between the array of memory blocks.

10. The memory circuit of claim 9, wherein when the second block of memory bits is disconnected from the array of memory blocks, the first block of memory bits remains coupled to the single column decoder.

11. The memory circuit of claim 8, wherein the plurality of switches couples a plurality of bit lines from the first block of memory to a plurality of bit lines from the second block of memory.

12. The memory circuit of claim 8, wherein the memory circuit is configurable by a configuration RAM (CRAM) bit, wherein the plurality of switches is transitioned based on the CRAM bit.

13. The memory circuit of claim 8, wherein the second block of memory bits is disconnected from the first block of memory bits if the second block of memory bits is unused.

14. The memory circuit of claim 13, wherein the plurality of switches is a plurality of one time programmable (OTP) switches.

15. A method of designing a memory circuit, comprising:
receiving an operating frequency of the memory circuit in an integrated circuit (IC) design;
receiving a number of memory bits required in the IC design; and
setting a plurality of switches to transition to one of an enabled state to enable a plurality of bit lines in the memory circuit or a disabled state to disable the plurality of bit lines in the memory circuit based on the number of memory bits required in the IC design, wherein the plurality of switches is transitioned to an enabled state when operating the memory circuit at a first frequency, and wherein the plurality of switches is transitioned the disabled state when operating the memory circuit at a second frequency, wherein the transition of the plurality of switches to the enabled state or the disabled state impacts a number of memory bits that are available in the memory circuit, wherein at least one method operation is executed through a processor.

16. The method of claim 15, wherein the second frequency is higher than the first frequency.

17. The method of claim 15, wherein a total number of memory bits that are available in the memory circuit is reduced when the plurality of switches in the IC design is transitioned to the disabled state.

18. The method of claim 15, wherein an access time of the memory circuit is reduced when the plurality of switches in the IC design is transitioned to the disabled state.

19. The method of claim 15, further comprising:
setting a CRAM bit, wherein the setting of the CRAM bit determines the setting of the plurality of switches.

20. The memory circuit of claim 1, wherein the particular state comprises an enabled state, wherein the transition of the plurality of switches comprises a transition to the enabled state, wherein when transitioned to the enabled state, the second memory block is coupled to the array and the number of memory bits that are available in the array of memory blocks is increased.

* * * * *